US012744064B2

(12) United States Patent
Cho et al.

(10) Patent No.: US 12,744,064 B2
(45) Date of Patent: Sep. 22, 2026

(54) MEMORY DEVICE RELATED TO SIGNAL TRANSMISSION

(71) Applicant: SK hynix Inc., Icheon-si (KR)

(72) Inventors: Kyung Jun Cho, Icheon-si (KR); Jin Hyung Lee, Icheon-si (KR); Yeon Ho Lee, Icheon-si (KR); Hyun Bae Lee, Icheon-si (KR); Tae Sik Yun, Icheon-si (KR); Chun Seok Jeong, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 161 days.

(21) Appl. No.: 18/770,360

(22) Filed: Jul. 11, 2024

(65) Prior Publication Data

US 2025/0029640 A1 Jan. 23, 2025

(30) Foreign Application Priority Data

Jul. 21, 2023 (KR) ........................ 10-2023-0095564
Mar. 14, 2024 (KR) ........................ 10-2024-0036099

(51) Int. Cl.

*H10W 90/00* (2026.01)
*G11C 7/10* (2006.01)
*H10B 80/00* (2023.01)
*H10W 90/20* (2026.01)

(52) U.S. Cl.

CPC ........... *G11C 7/1048* (2013.01); *H10B 80/00* (2023.02); *H10W 90/00* (2026.01); *H10W 90/297* (2026.01); *H10W 90/722* (2026.01)

(58) Field of Classification Search

CPC ... G11C 7/1048; G11C 7/1057; G11C 7/1084; H10B 80/00; H10W 90/00; H10W 90/297; H10W 90/722

See application file for complete search history.

(56) References Cited

U.S. PATENT DOCUMENTS

2017/0154655 A1* 6/2017 Seo ........................ G11C 5/147
2021/0225423 A1* 7/2021 Moon ................. G11C 11/4074
2021/0273110 A1 9/2021 Onuki et al.

* cited by examiner

*Primary Examiner* — Mohammed A Bashar

(74) *Attorney, Agent, or Firm* — WILLIAM PARK AND ASSOCIATES LTD.

(57) ABSTRACT

A memory device includes a base die configured to transmit transmission data that are driven to a first voltage range through a transmission line based on base data, and a core die configured to generate core data by shifting a voltage level of the transmission data received through the transmission line to a second voltage range.

25 Claims, 7 Drawing Sheets

21
201
203
BD1
BD2
BD3
TD1
TD2
TD3
CD1
CD2
CD3
TX_EN
TX-EN
RX-EN
VDD1
VDD2
VSS
202-1
202-2
202-3
211-1
211-2
211-3
213-1
213-2
213-3

MEMORY DEVICE RELATED TO SIGNAL TRANSMISSION

CROSS-REFERENCE TO RELATED APPLICATIONS

The present application claims priority under 35 U.S.C. § 119(a) to Korean Patent Application Nos. 10-2023-0095564 and 10-2024-0036099, filed in the Korean Intellectual Property Office on Jul. 21, 2023 and Mar. 14, 2024, respectively, the entire contents of which applications are incorporated herein by reference.

BACKGROUND

The present disclosure relates to a memory device related to signal transmission.

Recently, a stack memory system, such as high bandwidth memory (HBM), is used in wide application fields due to an excellent bandwidth and energy efficiency. Unlike the existing memory system using a parallel data bus, the stack memory system includes a memory device consisting of a base die and a core die that are connected by through silicon vias (TSVs) (hereinafter denoted as "through vias"). In order for data to be stored in or to be output from the core die, the transmission of the data is required between the base die and the core die.

SUMMARY

In an embodiment, a memory device may include a base die configured to transmit transmission data that are driven to a first voltage range through a transmission line based on base data, and a core die configured to generate core data by shifting a voltage level of the transmission data received through the transmission line to a second voltage range.

In an embodiment, a memory device may include a base die configured to shift the level of base data that are driven to a first voltage range to a second voltage range and configured to transmit transmission data through a transmission line based on a transmission enable signal, and a core die configured to generate core data based on the transmission data and a reception enable signal.

In an embodiment, a memory device may include a core die configured to generate transmission data in a second voltage range by buffering core data and configured to transmit the transmission data to a transmission line, and a base die configured to buffer the transmission data, configured to shift a voltage level of the transmission data to a first voltage range, and configured to generate normal data or repair data depending on whether the transmission data have been repaired.

In an embodiment, a memory device may include a core die configured to generate transmission data in a second voltage range by buffering core data and configured to transmit the transmission data to a transmission line, and a base die configured to shift a voltage level of the transmission data to a first voltage range and configured to generate normal data or repair data depending on whether the transmission data have been repaired.

BRIEF DESCRIPTION OF THE DRAWINGS

FIG. 3 illustrates a construction of a memory device according to still another example of the present disclosure.

FIG. 5 illustrates a construction of a memory device according to still another example of the present disclosure.

DETAILED DESCRIPTION

In the descriptions of the following embodiments, the term "preset" indicates that the numerical value of a parameter is previously decided, when the parameter is used in a process or algorithm. According to an embodiment, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. In contrast, when one component is referred to as being "directly coupled" or "directly connected" to another component, it should be understood that the components are directly coupled or connected to each other without another component interposed therebetween.

Hereafter, the present disclosure will be described in more detail through embodiments. The embodiments are only used to exemplify the present disclosure, and the scope of the present disclosure is not limited by the embodiments.

Figure 1:
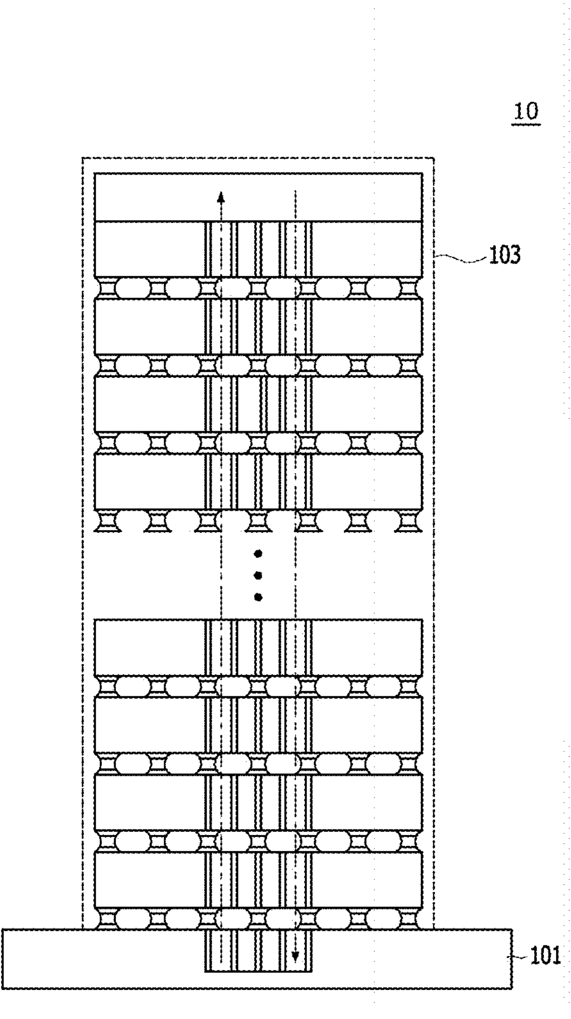
FIG. 1 illustrates a construction of a memory device according to an example of the present disclosure.

FIG. 1 illustrates a construction of a memory device 10 according to an example of the present disclosure.

As illustrated in FIG. 1, the memory device 10 may include a base die 101 and a core die 103. A wafer may be cut and divided into several dies. Various integrated circuits may be formed in each die. The base die 101 may include a logic circuit and a control circuit that control an overall operation of the memory device 10. For example, the base die 101 may include a circuit that communicates with a controller or a processor (e.g., 503 in FIG. 7) and a circuit that controls data transmission to the core die 103. The core die 103 may include multiple core slices (e.g., 513, 515, 517, and 519 in FIG. 7), each of which including a memory cell array for storing data. The core slices may be connected through a through silicon via (541 in FIG. 7). The base die 101 may control the core die 103 to store data in the core die 103 or to output data that have been stored in the core die 103. For example, by receiving data that are transmitted by the base die 101 by shifting the level of the data in the core die 103 that operates at a higher voltage range than the base die 101, the integrity of a signal can be secured, and power efficiency and stability can be secured voltage range. In another example, by controlling the base die 101 to transmit transmission data at a high voltage range to the core die 103 by using a transistor having a thick insulating layer, the integrity of a signal can be secured, and power efficiency and stability can be secured voltage range. "Thick" may be defined as a thickness that is thicker than other insulating layers in the base die 101 or core die 103. In another example, the integrity of a signal can be further improved by controlling the base die 101 to transmit the transmission data in a high voltage range to the core die 103 by adjusting the duty ratio of the transmission data when the transmission data are transmitted. In yet another example, by controlling the base die 101 to shift the level of the transmission data that are received from the core die 103 to a low voltage range, the integrity of a signal can be secured, and power efficiency and stability can be secured voltage range.

Figure 2:
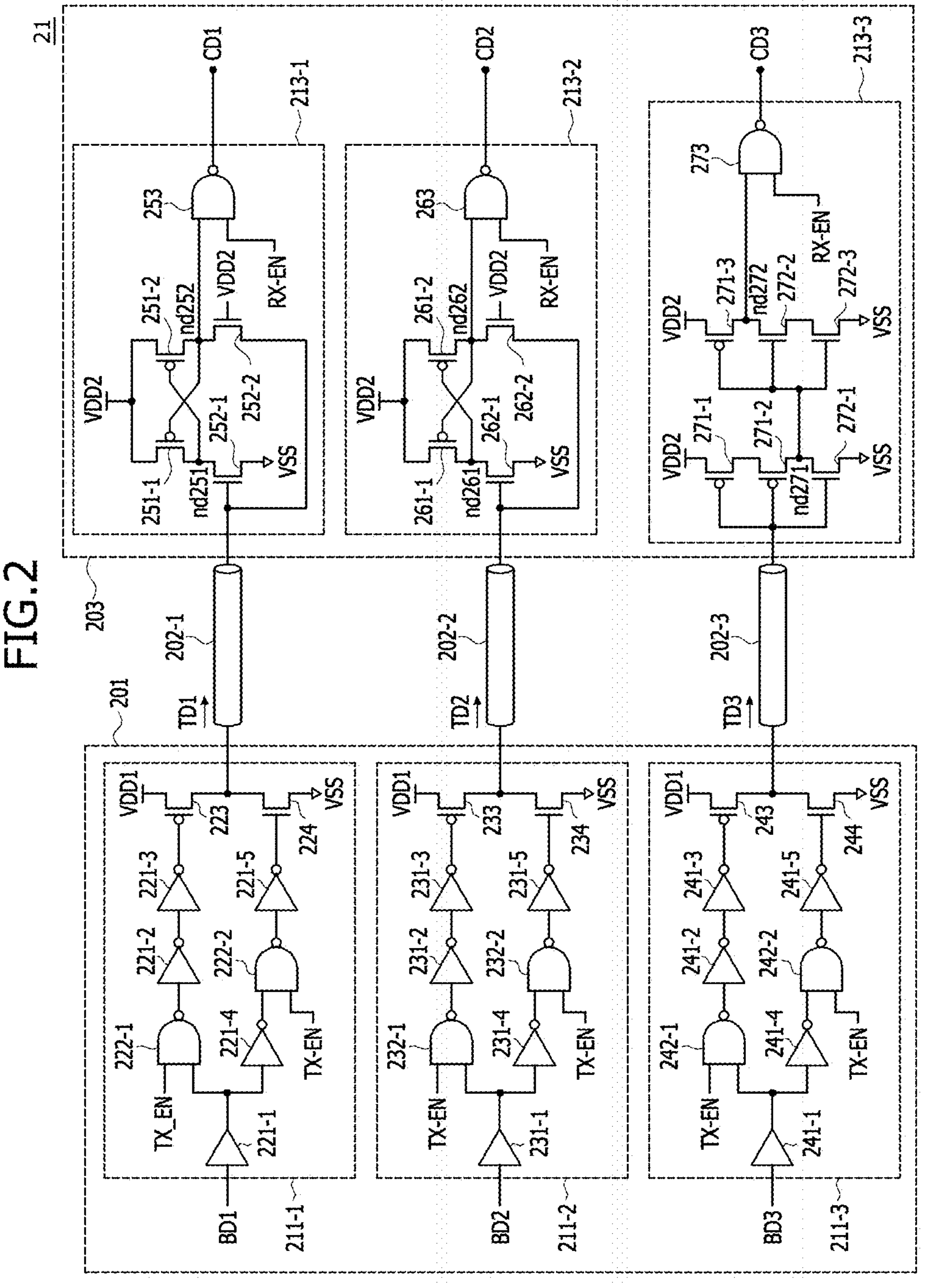
FIG. 2 illustrates a construction of a memory device according to another example of the present disclosure.

FIG. 2 illustrates a construction of a memory device 21 according to another example of the present disclosure. As illustrated in FIG. 2, the memory device 21 may include a base die 201, transmission lines 202-1, 202-2, and 202-3, and a core die 203.

The base die 201 may include a first transmission circuit 211-1, a second transmission circuit 211-2, and a third transmission circuit 211-3. The base die 201 may transmit first transmission data TD1 that are driven to a first voltage range, which is set between a first power VDD1 and a ground voltage VSS, to the core die 203 through the first transmission line 202-1 based on first base data BD1. The base die 201 may transmit second transmission data TD2 that are driven to the first voltage range to the core die 203 through the second transmission line 202-2 based on second base data BD2. The base die 201 may transmit third transmission data TD3 that are driven to the first voltage range to the core die 203 through the third transmission line 202-3 based on third base data BD3.

The first transmission circuit 211-1 may include a buffer 221-1, inverters 221-2, 221-3, 221-4, and 221-5, NAND gates 222-1 and 222-2, a PMOS transistor 223, and an NMOS transistor 224. The buffer 221-1 may output the first base data BD1 by buffering the first base data BD1. The NAND gate 222-1 may receive the output signal of the buffer 221-1 and a transmission enable signal TX-EN and may perform a NAND operation on the output signal of the buffer 221-1 and a transmission enable signal TX-EN. The transmission enable signal TX-EN may be enabled for the base die 201 to transmit the base data BD1, BD2, and BD3. The inverter 221-2 may invert and buffer the output signal of the NAND gate 222-1. The inverter 221-3 may invert and buffer the output signal of the inverter 221-2. The PMOS transistor 223 may be turned on based on the output signal of the inverter 221-3 and may drive the first transmission data TD1 to the first power VDD1. The inverter 221-4 may invert and buffer the output signal of the buffer 221-1. The NAND gate 222-2 may receive the output signal of the inverter 221-4 and the transmission enable signal TX-EN and may perform a NAND operation on the output signal of the inverter 221-4 and the transmission enable signal TX-EN. The inverter 221-5 may invert and buffer the output signal of the NAND gate 222-2. The NMOS transistor 224 may be turned on based on the output signal of the inverter 221-5 and may drive the first transmission data TD1 to the ground voltage VSS. The PMOS transistor 223 and the NMOS transistor 224 may each operate as a driving element. The first transmission circuit 211-1 may transmit the first transmission data TD1 to the core die 203 through the first transmission line 202-1.

The second transmission circuit 211-2 may include a buffer 231-1, inverters 231-2, 231-3, 231-4, and 231-5, NAND gates 232-1 and 232-2, a PMOS transistor 233, and an NMOS transistor 234. The buffer 231-1 may buffer the second base data BD2. The NAND gate 232-1 may receive the output signal of the buffer 231-1 and the transmission enable signal TX-EN and may perform a NAND operation on the output signal of the buffer 231-1 and the transmission enable signal TX-EN. The inverter 231-2 may invert and buffer the output signal of the NAND gate 232-1. The inverter 231-3 may invert and buffer the output signal of the inverter 231-2. The PMOS transistor 233 may be turned on based on the output signal of the inverter 231-3 and may drive the second transmission data TD2 to the first power VDD1. The inverter 231-4 may invert and buffer the output signal of the buffer 231-1. The NAND gate 232-2 may receive the output signal of the inverter 231-4 and the transmission enable signal TX-EN and may perform a NAND operation on the output signal of the inverter 231-4 and the transmission enable signal TX-EN. The inverter 231-5 may invert and buffer the output signal of the NAND gate 232-2. The NMOS transistor 234 may be turned on based on the output signal of the inverter 231-5 and may drive the second transmission data TD2 to the ground voltage VSS. The PMOS transistor 233 and the NMOS transistor 234 may each operate as a driving element. The second transmission circuit 211-2 may transmit the second transmission data TD2 to the core die 203 through the second transmission line 202-2.

The third transmission circuit 211-3 may include a buffer 241-1, inverters 241-2, 241-3, 241-4, and 241-5, NAND gates 242-1 and 242-2, a PMOS transistor 243, and an NMOS transistor 244. The buffer 241-1 may buffer the third base data BD3. The NAND gate 242-1 may receive the output signal of the buffer 241-1 and the transmission enable signal TX-EN and may perform a NAND operation on the output signal of the buffer 241-1 and the transmission enable signal TX-EN. The inverter 241-2 may invert and buffer the output signal of the NAND gate 242-1. The inverter 241-3 may invert and buffer the output signal of the inverter 241-2. The PMOS transistor 243 may be turned on based on the output signal of the inverter 241-3 and may drive the third transmission data TD3 to the first power VDD1. The inverter 241-4 may invert and buffer the output signal of the buffer 241-1. The NAND gate 242-2 may receive the output signal of the inverter 241-4 and the transmission enable signal TX-EN and may perform a NAND operation on the output signal of the inverter 241-4 and the transmission enable signal TX-EN. The inverter 241-5 may invert and buffer the output signal of the NAND gate 242-2. The NMOS transistor 244 may be turned on based on the output signal of the inverter 241-5 and may drive the third transmission data TD3 to the ground voltage VSS. The PMOS transistor 243 and the NMOS transistor 244 may each operate as a driving element. The third transmission circuit 211-3 may transmit the third transmission data TD3 to the core die 203 through the third transmission line 202-3.

The core die 203 may include a first reception circuit 213-1, a second reception circuit 213-2, and a third reception circuit 213-3. The core die 203 may generate first core data CD1 by shifting the level of the first transmission data TD1 that is received through the first transmission line 202-1 to a second voltage range that is set between a second power VDD2 and the ground voltage VSS. The second power VDD2 may be set to have a higher voltage level than the first power VDD1, but this is merely an embodiment and the present disclosure is not limited thereto. The core die 203 may generate second core data CD2 by shifting the level of the second transmission data TD2 that is received through the second transmission line 202-2 to the second voltage range. The core die 203 may generate third core data CD3 by shifting the level of the third transmission data TD3 that is received through the third transmission line 202-3 to the second voltage range.

The first reception circuit 213-1 may include PMOS transistors 251-1 and 251-2, NMOS transistors 252-1 and 252-2, and a NAND gate 253. The PMOS transistor 251-1 may be turned on based on the signal of a node nd252 and may drive a node nd251 to the second power VDD2. The second power VDD2 may be set to have a higher voltage level than the first power VDD1. The PMOS transistor 251-2 may be turned on based on the signal of the node nd251 and may drive the node nd252 to the second power VDD2. The NMOS transistor 252-1 may be turned on based on the first transmission data TD1 and may drive the node nd251 to the ground voltage VSS. The NMOS transistor 252-2 may maintain a turn-on state based on the second power VDD2 and may drive the node nd252 to the voltage level of the first transmission data TD1. The NAND gate 253 may receive the output signal of the node nd252 and a reception enable signal RX-EN and may generate the first core data CD1 by performing a NAND operation on the output signal of the node nd252 and the reception enable signal RX-EN. The reception enable signal RX-EN may be enabled to receive the transmission data TD1, TD2, and TD3 from the core die 203.

The second reception circuit 213-2 may include PMOS transistors 261-1 and 261-2, NMOS transistors 262-1 and 262-2, and a NAND gate 263. The PMOS transistor 261-1 may be turned on based on the signal of a node nd262 and may drive a node nd261 to the second power VDD2. The PMOS transistor 261-2 may be turned on based on the signal of the node nd261 and may drive the node nd262 to the second power VDD2. The NMOS transistor 262-1 may be turned on based on the first transmission data TD1 and may drive the node nd261 to the ground voltage VSS. The NMOS transistor 262-2 may maintain a turn-on state based on the second power VDD2 and may drive the node nd262 to the voltage level of the second transmission data TD2. The NAND gate 263 may receive the output signal of the node nd262 and the reception enable signal RX-EN and may generate the second core data CD2 by performing a NAND operation on the output signal of the node nd262 and the reception enable signal RX-EN.

The third reception circuit 213-3 may include PMOS transistors 271-1, 271-2, and 271-3, NMOS transistors 272-1, 272-2, and 271-3 and a NAND gate 273. The PMOS transistors 271-1 and 271-2 may be connected in series between the second power VDD2 and a node nd271. The PMOS transistors 271-1 and 271-2 may each be turned on based on the voltage level of the third transmission data TD3 and may each drive the node nd271 to the second power VDD2. The NMOS transistor 272-1 may be turned on based on the third transmission data TD3 and may drive the node nd271 to the ground voltage VSS. The PMOS transistors 271-3 may be turned on based on the signal of the node nd271 and may drive a node nd272 to the second power VDD2. The NMOS transistors 272-2 and 271-3 may be connected in series between the node nd272 and the ground voltage VSS. The NMOS transistors 272-2 and 271-3 may each be turned on based on the signal of the node nd271 and may each drive the node nd272 to the ground voltage VSS. The NAND gate 273 may receive the output signal of the node nd272 and the reception enable signal RX-EN and may generate the third core data CD3 by performing a NAND operation on the output signal of the node nd272 and the reception enable signal RX-EN.

By controlling the transmission data TD1, TD2, and TD3 that are driven to the first voltage range that is set between the first power VDD1 and the ground voltage VSS to be transmitted from the base die 201 to the core die 203 and controlling the transmission data TD1, TD2, and TD3 to be received from the core die 203 by shifting the voltage levels of the transmission data TD1, TD2, and TD3 to the second voltage range that is set between the second power VDD2 and the ground voltage VSS, the memory device 21, constructed as described above, can secure the integrity of a signal, power efficiency, and stability when data are transmitted between the base die 201 and the core die 203 that operate in different voltage ranges.

Figure 3:
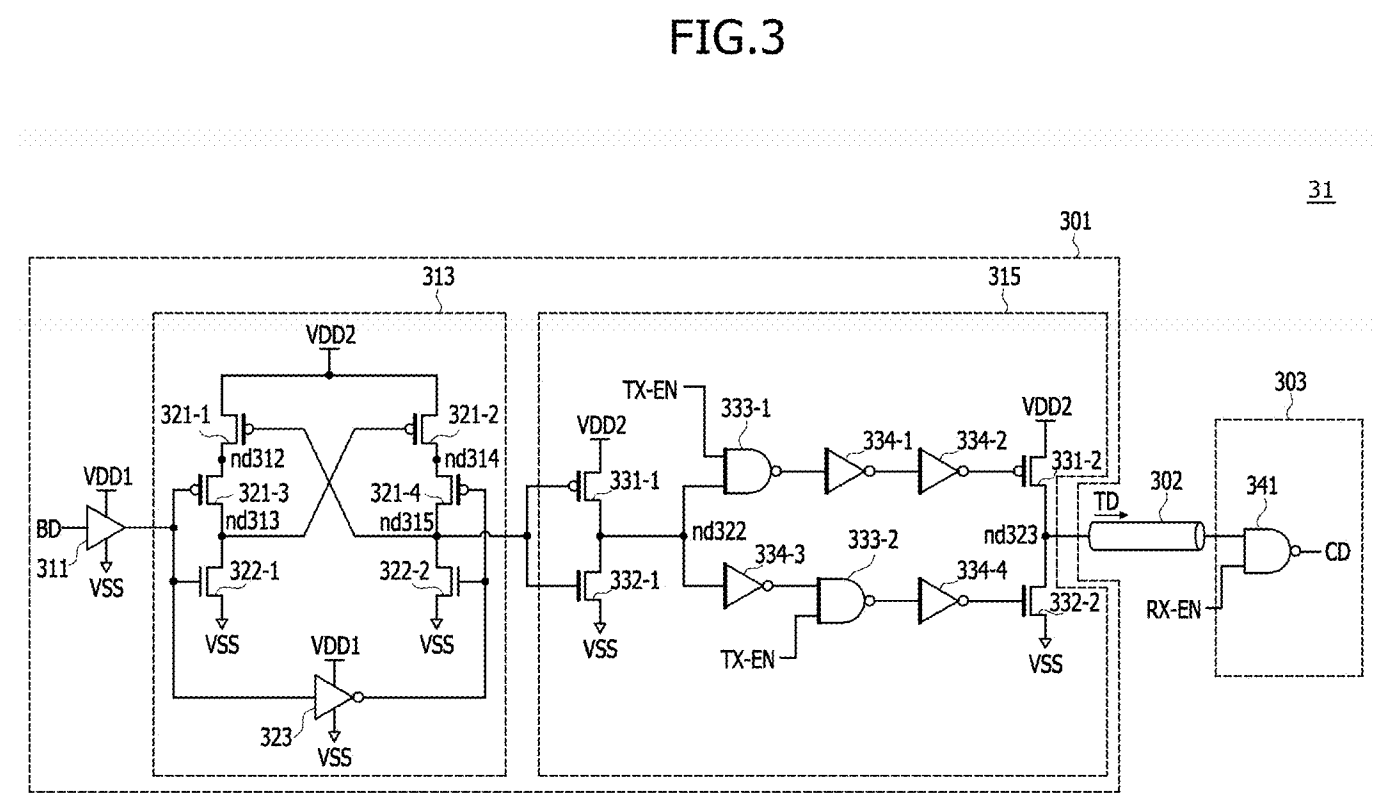

FIG. 3 illustrates a construction of a memory device 31 according to still another example of the present disclosure. As illustrated in FIG. 3, the memory device 31 may include a base die 301, a transmission line 302, and a core die 303.

The base die 301 may buffer base data BD, which is in a first voltage range, may generate transmission data TD by shifting the level of the transmission data TD to a second voltage range, and may then transmit the generated transmission data TD to the core die 303 through the transmission line 302. The base die 301 may include a buffer 311, a level shifter 313, and a driving circuit 315.

The buffer 311 may output the base data BD in the first voltage range, which is set between first power VDD1 and a ground voltage VSS, by buffering the base data BD.

The level shifter 313 may output the output signal of the buffer 311, which is in the first voltage range, by shifting the level of the output signal to the second voltage range that is set between second power VDD2 and the ground voltage VSS. The level shifter 313 may include PMOS transistors 321-1, 321-2, 321-3, and 321-4, NMOS transistors 322-1 and 322-2, and an inverter 323. The PMOS transistor 321-1 may be connected between a terminal for the second power VDD2 and a node nd312, may be turned on based on the signal of a node nd315, and may drive the node nd312 to the second power VDD2. The PMOS transistor 321-2 may be connected between the terminal for the second power VDD2 and a node nd314, may be turned on based on the signal of a node nd313, and may drive the node nd314 to the second power VDD2. The PMOS transistor 321-3 may be connected between the node nd312 and the node nd313, may be turned on based on the output signal of the buffer 311, and may electrically connect the node nd312 to the node nd313. The PMOS transistor 321-4 may be connected between the node nd314 and the node nd315, may be turned on based on the output signal of the inverter 323, and may electrically connect the node nd314 to the node nd315. The NMOS transistor 322-1 may be connected between the node nd313 and the ground voltage VSS, may be turned on based on the output signal of the buffer 311, and may drive the node nd313 to the ground voltage VSS. The NMOS transistor 322-2 may be connected between the node nd315 and the ground voltage VSS, may be turned on based on the output signal of the inverter 323, and may drive the node nd315 to the ground voltage VSS. The inverter 323 may output the output signal of the buffer 311 by inverting and buffering the output signal of the buffer 311. The PMOS transistors 321-1, 321-2, 321-3, and 321-4 may each be implemented by using an insulating layer that is thicker than that of each of the NMOS transistors 322-1 and 322-2 and the inverter 323 to secure the integrity of a signal, power efficiency, and stability when the second power VDD2, having a higher voltage level than the first power VDD1, is applied to each of the PMOS transistors 321-1, 321-2, 321-3, and 321-4. In another embodiment, the PMOS transistors 321-1, 321-2, 321-3, and 321-4 may each be implemented by using an insulating layer having the same thickness as that of each of the NMOS transistors 322-1 and 322-2 and the inverter 323.

The driving circuit 315 may receive the output signal of the level shifter 313 through the node nd315. The driving circuit 315 may generate the transmission data TD that are driven to the second voltage range based on the output signal of the level shifter 313. The driving circuit 315 may include PMOS transistors 331-1 and 331-2, NMOS transistors 332-1 and 332-2, NAND gates 333-1 and 333-2, and inverters 334-1, 334-2, 334-3, and 334-4. The PMOS transistor 331-1 may be connected between the second power VDD2 and a node nd322, may be turned on based on the signal of the node nd315, and may drive the node nd322 to the second power VDD2. The NMOS transistors 332-1 may be connected between the node nd322 and the ground voltage VSS, may be turned on based on the signal of the node nd315, and may drive the node nd322 to the ground voltage VSS. The NAND gate 333-1 may receive a transmission enable signal TX-EN and the signal of the node nd322 and may perform a NAND operation on the transmission enable signal TX-EN and the signal of the node nd322. The transmission enable signal TX-EN may be enabled to transmit the base data BD by the base die 301. The inverter 334-1 may invert and buffer the output signal of the NAND gate 333-1. The inverter 334-1 may invert and buffer the output signal of the inverter 334-2. The inverter 334-3 may output the signal of the node nd322 by inverting and buffering the signal of the node nd322. The NAND gate 333-2 may receive the transmission enable signal TX-EN and the output signal of the inverter 334-3 and may perform a NAND operation on the transmission enable signal TX-EN and the output signal of the inverter 334-3. The inverter 334-4 may invert and buffer the output signal of the NAND gate 333-2. The PMOS transistor 331-2 may be connected between the second power VDD2 and a node nd323, may be turned on based on the output signal of the inverter 334-2, and may drive the transmission data TD that are output through the node nd323 to the second power VDD2. The NMOS transistors 332-2 may be connected between the node nd323 and the ground voltage VSS, may be turned on based on the output signal of the inverter 334-4, and may drive the transmission data TD that are output through the node nd323 to the ground voltage VSS. The PMOS transistors 331-1 and 331-2, the NMOS transistors 332-1 and 332-2, the NAND gates 333-1 and 333-2, and the inverters 334-1, 334-2, 334-3, and 334-4 may each be implemented by using an insulating layer that is thicker than that of each of the NMOS transistors 322-1 and 322-2 and the inverter 323 to secure the integrity of a signal, power efficiency, and stability when the second power VDD2, having a higher voltage level than the first power VDD1 is applied to each of the PMOS transistors 331-1 and 331-2, the NMOS transistors 332-1 and 332-2, the NAND gates 333-1 and 333-2, and the inverters 334-1, 334-2, 334-3, and 334-4. In another embodiment, the PMOS transistors 331-1 and 331-2, the NMOS transistors 332-1 and 332-2, the NAND gates 333-1 and 333-2, and the inverters 334-1, 334-2, 334-3, and 334-4 may each be implemented by using an insulating layer having the same thickness as that of each of the NMOS transistors 322-1 and 322-2 and the inverter 323.

The core die 303 may generate core data CD based on the transmission data TD that are received through the transmission line 302. The core die 303 may include a NAND gate 341. The NAND gate 341 may generate the core data CD by performing a NAND operation based on the transmission data TD that are received through the transmission line 302 and a reception enable signal RX-EN. The reception enable signal RX-EN may be enabled to receive the transmission data TD by the core die 303.

The memory device 31 constructed as described above can secure the integrity of a signal, power efficiency, and stability when data are transmitted between the base die 301 and the core die 303 that operate in different voltage ranges, in a way that the base die 301 generates the transmission data TD by shifting the voltage level of the base data BD that is set in the first voltage range, which is set between the first power VDD1 and the ground voltage VSS, to the second voltage range, which is set between the second power VDD2 and the ground voltage VSS, and transmits the transmission data TD to the core die 303. Furthermore, the memory device 31 can secure the integrity of a signal, power efficiency, and stability because the PMOS transistors 321-1, 321-2, 321-3, 321-4, 331-1, and 331-2 to which the second power VDD2, which has a higher voltage level than the first power VDD1, is applied, the NMOS transistors 332-1 and 332-2, the NAND gates 333-1 and 333-2, and the inverters 334-1, 334-2, 334-3, and 334-4 are each implemented as a MOS transistor using a thick insulating layer in the base die 301. In another embodiment, the PMOS transistors 321-1, 321-2, 321-3, 321-4, 331-1, and 331-2, the NMOS transistors 332-1 and 332-2, the NAND gates 333-1 and 333-2, and the inverters 334-1, 334-2, 334-3, and 334-4 may each be implemented as a MOS transistor using an insulating layer that is not as thick as the previous embodiment.

Figure 4:
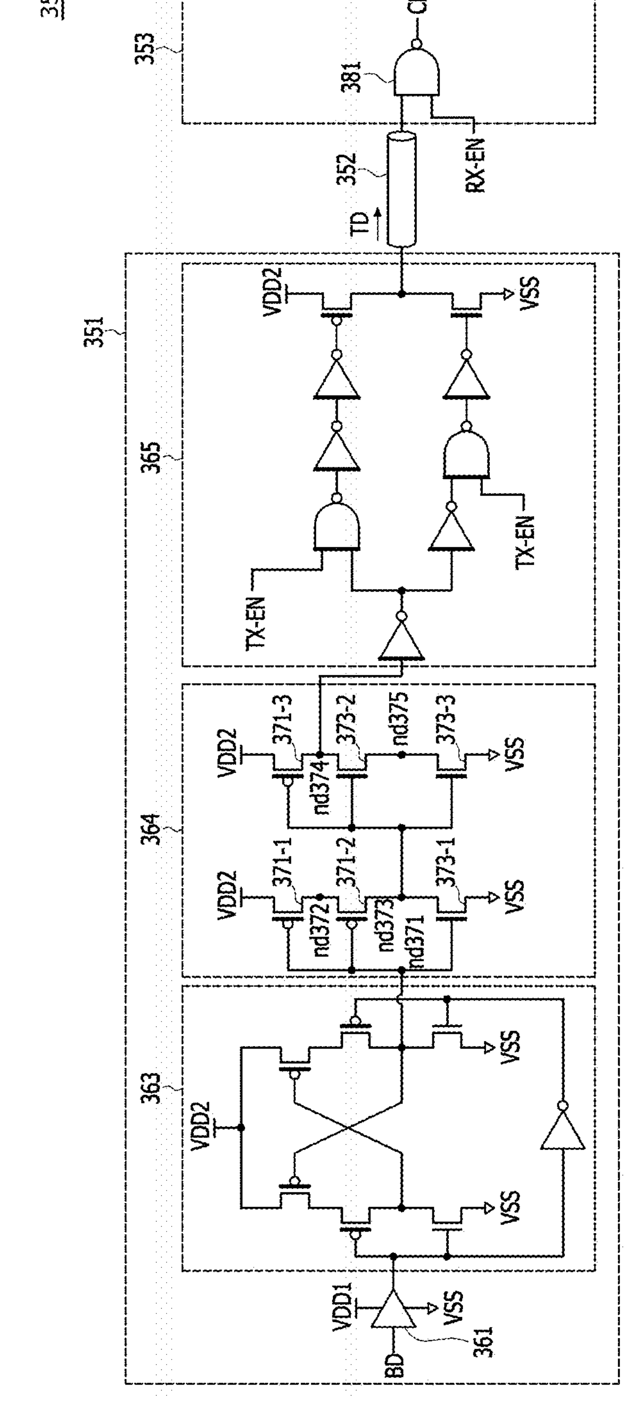
FIG. 4 illustrates a construction of a memory device according to still another example of the present disclosure.

FIG. 4 illustrates a construction of a memory device 35 according to still another example of the present disclosure. As illustrated in FIG. 4, the memory device 35 may include a base die 351, a transmission line 352, and a core die 353.

The base die 351 may buffer base data BD, which is in a first voltage range, may shift the level of the base data BD to a second voltage range, may generate transmission data TD by adjusting the duty ratio of the transmission data TD, and may transmit the generated transmission data TD to the core die 353 through the transmission line 352. The base die 351 may include a buffer 361, a level shifter 363, a duty ratio adjustment circuit 364, and a driving circuit 365.

The buffer 361 may output the base data BD in the first voltage range, which is set between first power VDD1 and a ground voltage VSS, by buffering the base data BD.

The level shifter 363 may output the output signal of the buffer 361, which is in the first voltage range, by shifting the level of the output signal of the buffer 361 to the second voltage range that is set between second power VDD2 and the ground voltage VSS. The level shifter 363 may be implemented in the same manner as the level shifter 313, illustrated in FIG. 3, and a description of a detailed construction and operation of the level shifter 363 has been omitted.

The duty ratio adjustment circuit 364 may output the output signal of the level shifter 363 that has been set in the second voltage range by adjusting the duty ratio of the output signal of the level shifter 363. The duty ratio adjustment circuit 364 may output the output signal of the level shifter 363 by adjusting the duty ratio of the output signal of the level shifter 363 to 50%, but this is merely an embodiment and the present disclosure is not limited thereto. The duty ratio adjustment circuit 364 may include PMOS transistors 371-1, 371-2, and 371-3 and NMOS transistors 373-1, 373-2, and 373-3. The PMOS transistors 371-1 and 371-2 may be connected in series between the second power VDD2 and a node nd373. The PMOS transistor 371-1 may be turned on based on the signal of the node nd371 and may drive the node nd372 to the second power VDD2. The PMOS transistor 371-2 may be turned on based on the signal of the node nd371 and may electrically connect a node nd372 to the node nd373. The NMOS transistor 373-1 may be connected between the node nd373 and the ground voltage VSS, may be turned on based on the signal of the node nd371, and may drive the node nd373 to the ground voltage VSS. The PMOS transistor 371-3 may be connected between the second power VDD2 and a node nd374, may be turned on based on the signal of the node nd373, and may drive the node nd374 to the second power VDD2. The NMOS transistors 373-2 and 373-3 may be connected in series between the node nd374 and the ground voltage VSS. The NMOS transistor 373-2 may be connected between the node nd374 and a node nd375, may be turned on based on the signal of the node nd373, and may electrically connect the node nd374 to a node nd375. The NMOS transistor 373-3 may be connected between the node nd375 and the ground voltage VSS, may be turned on based on the signal of the node nd373, and may drive the node nd375 to the ground voltage VSS.

The driving circuit 365 may generate the transmission data TD that is driven to the second voltage range based on the output signal of the duty ratio adjustment circuit 364. The driving circuit 365 may be implemented in the same manner as the level shifter 315, illustrated in FIG. 3, and a description of a detailed construction and operation of the driving circuit 365 has been omitted.

The core die 353 may generate core data CD based on the transmission data TD that are received through the transmission line 352. The core die 353 may include a NAND gate 381. The NAND gate 381 may generate the core data CD by performing a NAND operation based on the transmission data TD that are received through the transmission line 352 and a reception enable signal RX-EN. The reception enable signal RX-EN may be enabled to receive the transmission data TD by the core die 353.

The memory device 35, constructed as described above, can secure the integrity of a signal, power efficiency, and stability when data are transmitted between the base die 351 and the core die 353 that operate in different voltage ranges, in a way that the base die 351 shifts the level of the base data BD to the second voltage range, generates the transmission data TD by adjusting the duty ratio of the transmission data TD, and transmits the transmission data TD to the core die 353. Furthermore, the memory device 35 can secure the integrity of a signal, power efficiency, and stability by using a MOS transistor using a thick insulating layer in the base die 351.

Figure 5:
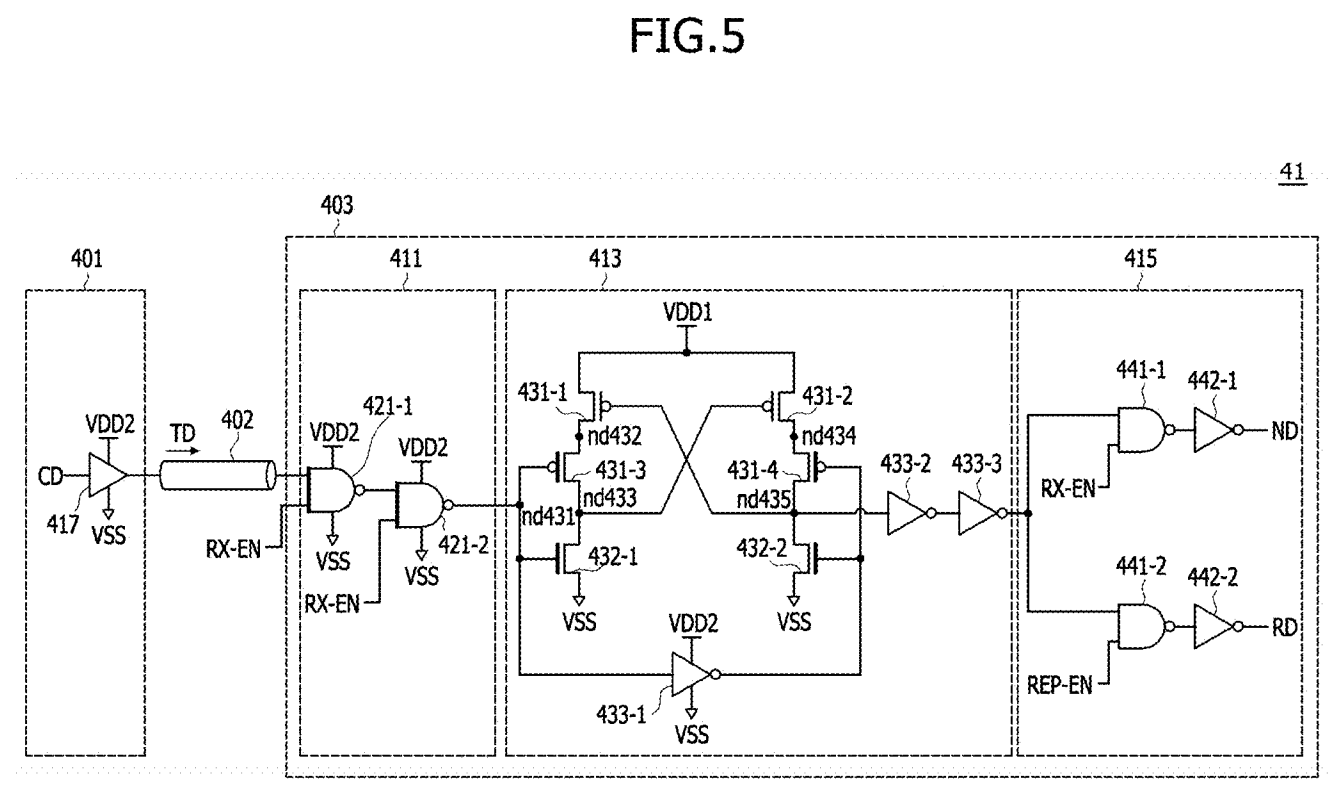

FIG. 5 illustrates a construction of a memory device 41 according to still another example of the present disclosure. As illustrated in FIG. 5, the memory device 41 may include a core die 401, a transmission line 402, and a base die 403.

The core die 401 may generate transmission data TD in a second voltage range that has been set between second power VDD2 and a ground voltage VSS, by buffering core data CD and may output the transmission data TD to the transmission line 402. The core die 401 may include a buffer 417. The buffer 417 may receive the core data CD and may generate the transmission data TD in the second voltage range by buffering the core data CD. The core die 401 may output the transmission data TD to the transmission line 402.

The base die 403 may buffer the transmission data TD that are received through the transmission line 402, may shift the level of the transmission data TD to a first voltage range that is set between first power VDD1 and the ground voltage VSS, and may generate normal data ND or repair data RD depending on whether the transmission data TD have been repaired. The base die 403 may include a data reception circuit 411, a level shifter 413, and a data selection generation circuit 415.

The data reception circuit 411 may receive the transmission data TD that are set in the second voltage range, and may output the transmission data TD in the second voltage range by buffering the transmission data TD. The data reception circuit 411 may include NAND gates 421-1 and 421-2. The NAND gate 421-1 may receive the transmission data TD and a reception enable signal RX-EN and may output the transmission data TD and the reception enable signal RX-EN by performing a NAND operation on the transmission data TD and the reception enable signal RX-EN. The reception enable signal RX-EN may be enabled to receive the transmission data TD from the core die 401. The NAND gate 421-2 may receive the output signal of the NAND gate 421-1 and the reception enable signal RX-EN and may output the output signal of the NAND gate 421-1 and the reception enable signal RX-EN by performing a NAND operation on the output signal of the NAND gate 421-1 and the reception enable signal RX-EN. The NAND gates 421-1 and 421-2 may each be implemented by using an insulating layer that is thicker than that of each of the PMOS transistors 431-1 and 431-2, the NAND gates 441-1 and 441-2, and the inverters 433-2, 433-3, 442-1, and 442-2 to secure the integrity of a signal, power efficiency, and stability when the second power VDD2 having a higher voltage level than the first power VDD1 is applied to each of the NAND gates 421-1 and 421-2. In another embodiment, the NAND gates 421-1 and 421-2 may each be implemented by using an insulating layer having the same thickness as that of each of the PMOS transistors 431-1 and 431-2, the NAND gates 441-1 and 441-2, and the inverters 433-2, 433-3, 442-1, and 442-2.

The level shifter 413 may output the output signal of the data reception circuit 411 by shifting the level of the output signal of the data reception circuit 411 to the first voltage range that is set between the first power VDD1 and the ground voltage VSS. The level shifter 413 may include PMOS transistors 431-1, 431-2, 431-3, and 431-4, NMOS transistors 432-1 and 432-2, and inverters 433-1, 433-2, and 433-3. The PMOS transistor 431-1 may be connected between a terminal for the first power VDD1 and a node nd432, may be turned on based on the signal of a node nd435, and may drive the node nd432 to the first power VDD1. The PMOS transistor 431-2 may be connected between the terminal for the first power VDD1 and a node nd434, may be turned on based on the signal of a node nd433, and may drive the node nd434 to the first power VDD1. The PMOS transistor 431-3 may be connected between the node nd432 and the node nd433, may be turned on based on the signal of a node nd431, and may electrically connect the node nd432 to the node nd433. The PMOS transistor 431-4 may be connected between the node nd434 and the node nd435, may be turned on based on the output signal of the inverter 433-1, and may electrically connect the node nd434 to the node nd435. The NMOS transistor 432-1 may be connected between the node nd433 and the ground voltage VSS, may be turned on based on the signal of the node nd431, and may drive the node nd433 to the ground voltage VSS. The NMOS transistor 432-2 may be connected between the node nd435 and the ground voltage VSS, may be turned on based on the output signal of the inverter 433-1, and may drive the node nd435 to the ground voltage VSS. The inverter 433-1 may output the signal of the node nd431 by inverting and buffering the signal of the node nd431. The inverter 433-2 may invert and buffer the signal of the node nd435. The inverter 433-3 may invert and buffer the output signal of the inverter 433-2. The PMOS transistors 431-3 and 431-4, the NMOS transistors 432-1 and 432-2, and the inverter 433-1 may each be implemented by using an insulating layer that is thicker than that of each of the PMOS transistors 431-1 and 431-2, the NAND gates 441-1 and 441-2, and the inverters 433-2, 433-3, 442-1, and 442-2 to secure the integrity of a signal, power efficiency, and stability when the second power VDD2 having a higher voltage level than the first power VDD1 is applied to each of the PMOS transistors 431-3 and 431-4, the NMOS transistors 432-1 and 432-2, and the inverter 433-1. In another embodiment, the PMOS transistors 431-3 and 431-4, the NMOS transistors 432-1 and 432-2, and the inverter 433-1 may each be implemented by using an insulating layer having the same thickness as that of each of the PMOS transistors 431-1 and 431-2, the NAND gates 441-1 and 441-2, and the inverters 433-2, 433-3, 442-1, and 442-2.

The data selection generation circuit 415 may generate the normal data ND by buffering the output signal of the level shifter 413 when a normal operation is performed because an error has not occurred in the transmission data TD. The data selection generation circuit 415 may generate the repair data RD by buffering the output signal of the level shifter 413 when a repair operation is performed because an error has occurred in the transmission data TD. The data selection generation circuit 415 may transmit the normal data ND to a circuit (not illustrated) in which a normal operation is performed and may transmit the repair data RD to a circuit (not illustrated) in which a repair operation is performed. The data selection generation circuit 415 may include NAND gates 441-1 and 441-2 and inverters 442-1 and 442-2. The NAND gate 441-1 and the inverter 442-1 may receive the output signal of the level shifter 413 and the reception enable signal RX-EN and may generate the normal data ND by performing an AND operation on the output signal of the level shifter 413 and the reception enable signal RX-EN. The reception enable signal RX-EN may be enabled to receive the transmission data TD from the base die 403 in the state in which an error has not occurred in the transmission data TD. The NAND gate 441-2 and the inverter 442-2 may receive the output signal of the level shifter 413 and a repair enable signal REP-EN and may generate the repair data RD by performing an AND operation on the output signal of the level shifter 413 and the repair enable signal REP-EN. The repair enable signal REP-EN may be enabled to receive the transmission data TD from the base die 403 in the state in which an error has occurred in the transmission data TD.

The memory device 41, constructed as described above, can secure the integrity of a signal, power efficiency, and stability when data are transmitted between the core die 401 and the base die 403 that operate in different voltage ranges by receiving, from the base die 403, the transmission data TD that have been driven to the second voltage range and transmitted by the core die 401 by shifting the level of the transmission data TD to the first voltage range. Furthermore, the memory device 41 can secure the integrity of a signal, power efficiency, and stability by using a MOS transistor using a thick insulating layer in the base die 403.

Figure 6:
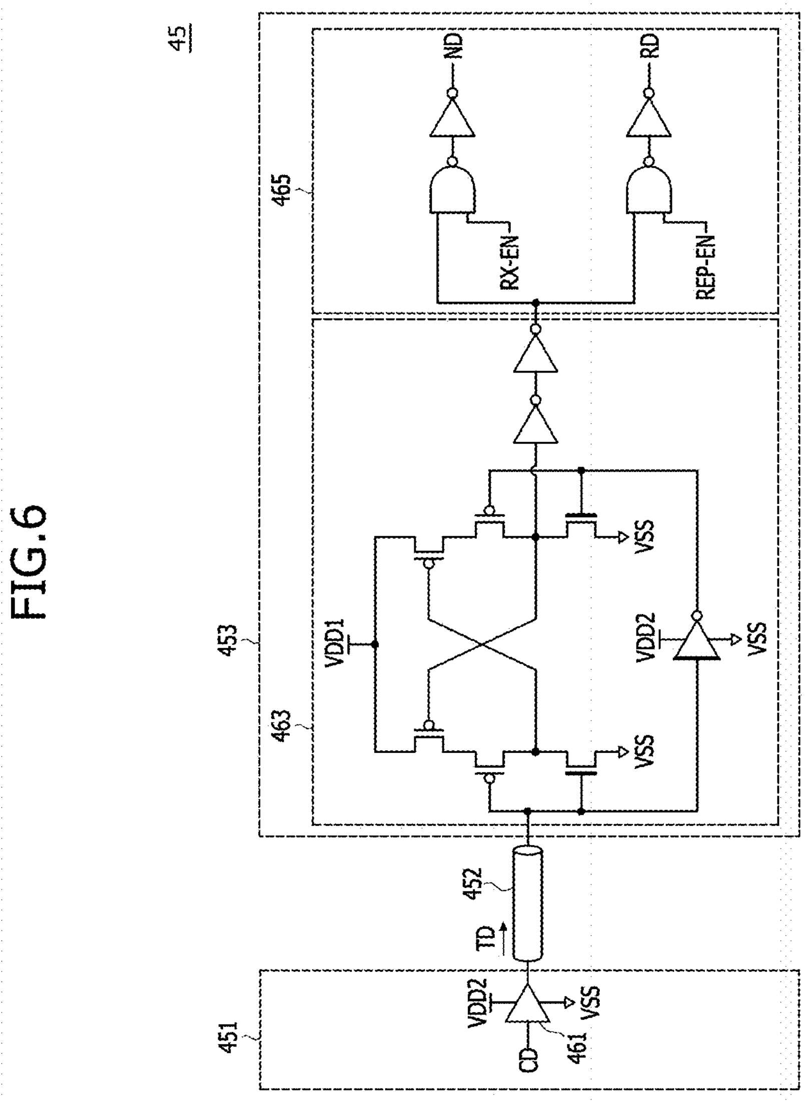
FIG. 6 illustrates a construction of a memory device according to still another example of the present disclosure.

FIG. 6 illustrates a construction of a memory device 45 according to still another example of the present disclosure.

As illustrated in FIG. 6, the memory device 45 may include a core die 451, a transmission line 452, and a base die 453.

The core die 451 may generate transmission data TD in a second voltage range, which is set between second power VDD2 and a ground voltage VSS, by buffering core data CD and may output the transmission data TD to the transmission line 452. The core die 451 may include a buffer 461. The buffer 461 may receive the core data CD and may generate the transmission data TD in the second voltage range, which is set between the second power VDD2 and the ground voltage VSS, by buffering the core data CD. The core die 451 may output the transmission data TD to the transmission line 452.

The base die 453 may buffer the transmission data TD that are received through the transmission line 452, may shift the level of the transmission data TD to a first voltage range that is set between first power VDD1 and the ground voltage VSS, and may generate normal data ND or repair data RD depending on whether the transmission data TD have been repaired. The base die 453 may include a level shifter 463 and a data selection generation circuit 465.

The level shifter 463 may output the output signal of the data reception circuit 461 by shifting the level of the output signal of the data reception circuit 461 to the first voltage range that is set between the first power VDD1 and the ground voltage VSS. The level shifter 463 may be implemented in the same manner as the level shifter 413, illustrated in FIG. 5, and a description of a detailed construction, and operation of the level shifter 463 has been omitted.

The data selection generation circuit 465 may generate the normal data ND by buffering the output signal of the level shifter 463 when a normal operation is performed because an error has not occurred in the transmission data TD. The data selection generation circuit 465 may generate the repair data RD by buffering the output signal of the level shifter 463 when a repair operation is performed because an error has occurred in the transmission data TD. The data selection generation circuit 465 may transmit the normal data ND to a circuit (not illustrated) in which a normal operation is performed and may transmit the repair data RD to a circuit (not illustrated) in which a repair operation is performed. The data selection generation circuit 465 may be implemented in the same manner as the data selection generation circuit 415 illustrated in FIG. 5, and a description of a detailed construction, and operation of the data selection generation circuit 465 has been omitted.

The memory device 45 constructed as described above can secure the integrity of a signal, power efficiency, and stability when data are transmitted between the core die 451 and the base die 463 that operate in different voltage ranges by receiving the transmission data TD that have been driven to the second voltage range and transmitted by the core die 451 by shifting the level of the transmission data TD to the first voltage range in the base die 463. Furthermore, the memory device 45 can secure the integrity of a signal, power efficiency, and stability by using a MOS transistor using a thick insulating layer in the base die 451.

Figure 7:
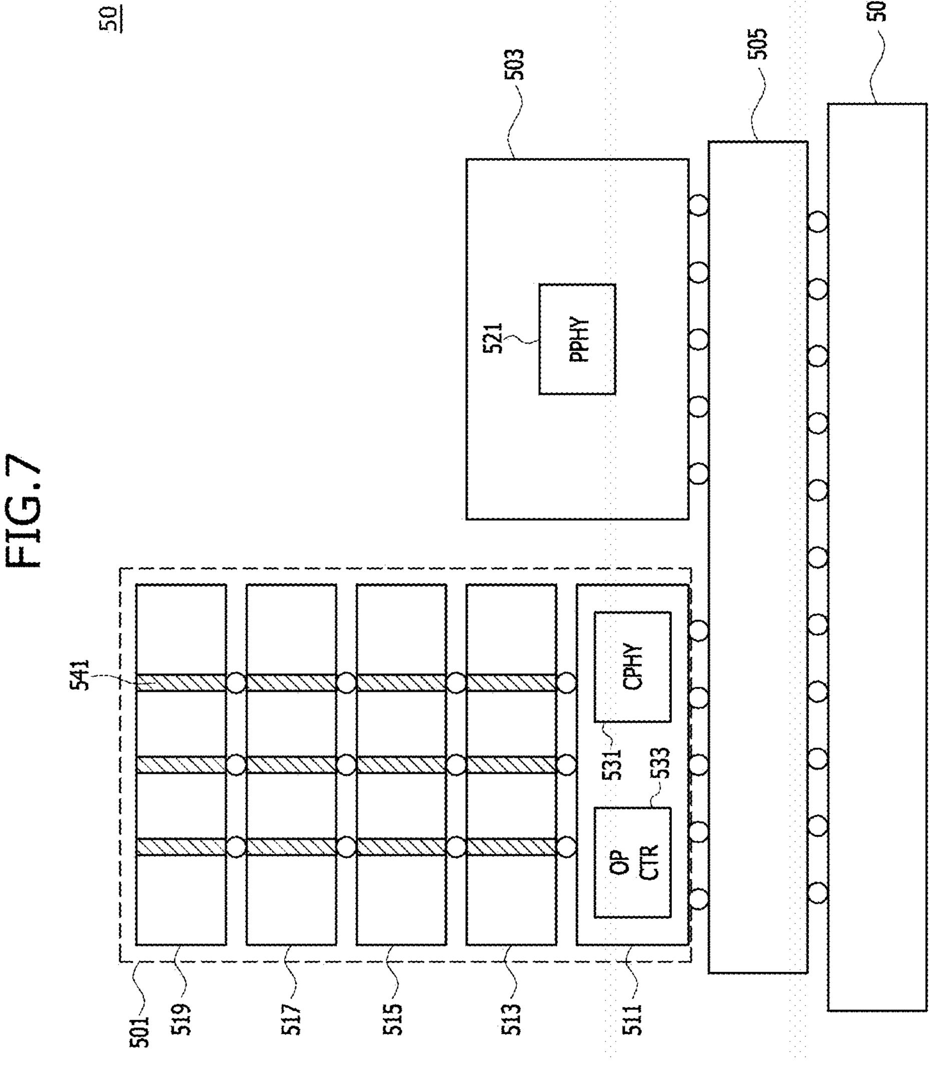
FIG. 7 illustrates a construction of a memory system according to an example of the present disclosure.

FIG. 7 illustrates a construction of a memory system 50 according to an example of the present disclosure.

As illustrated in FIG. 7, the stack memory system 50 may include a stack memory device 501, a processor 503, an interposer 505, and a substrate 507.

The interposer 505 may be formed over the substrate 507. The stack memory device 501 and the processor 503 may be formed over the interposer 505. The interposer 505 may be used to electrically connect the substrate 507, the stack memory device 501, and the processor 503 to each other. The substrate 507, the stack memory device 501, and the processor 503 may be electrically connected by using the interposer 505 including wires that have been variously formed due to the difference between the pitches of the substrate 507, the stack memory device 501, and the processor 503 is great.

The processor 503 may include a processor interface circuit (PPHY) 521. The processor 503 may apply a write control signal, including a command and an address for controlling various internal operations of the stack memory device 501, to the stack memory device 501 through the processor interface circuit 531, and may receive a read control signal from the stack memory device 501 through the processor interface circuit 531.

The stack memory device 501 may include a base die 511 and the core slices 514, 515, 517, and 519. The stack memory device 501 may be implemented as the memory device 10 as illustrated in FIG. 1, the memory device 21 as illustrated in FIG. 2, the memory device 31 as illustrated in FIG. 3, the memory device 35 as illustrated in FIG. 4, the memory device 41 as illustrated in FIG. 5, or the memory device 45 as illustrated in FIG. 6.

The core slices 514, 515, 517, and 519 may be sequentially stacked on the base die 511 and may each receive various signals from the base die 511 through the through vias 541.

The base die 511 may include a core interface circuit (CPHY) 531 and an operation control circuit (OP CTR) 533. The core interface circuit 531 may be set to be capable of communicating with the processor interface circuit 533, may transmit a write control signal transmitted by the processor 503 to the operation control circuit 533, and may apply a read control signal that is generated by the operation control circuit 533 to the processor 503.

The embodiments of the present disclosure have been described so far. A person having ordinary knowledge in the art to which the present invention pertains will understand that the present invention may be implemented in a modified form without departing from an intrinsic characteristic of the present disclosure. Accordingly, the disclosed embodiments should be considered from a descriptive viewpoint, not from a limitative viewpoint. The range of the present disclosure is described in the claims not the aforementioned description, and all differences within an equivalent range thereof should be construed as being included in the present disclosure.

What is claimed is:

1. A memory device comprising:
a base die configured to transmit transmission data that are driven to a first voltage range through a transmission line based on base data; and
a core die configured to generate core data by driving the transmission data received through the transmission line to a second voltage range,
wherein the second voltage range is higher than the first voltage range.

2. The memory device of claim 1, wherein the first voltage range is set between a first power and a ground voltage.

3. The memory device of claim 1, wherein the second voltage range is set between a second power and a ground voltage, and
wherein a voltage level of the second power is higher than a voltage level of the first power.

4. The memory device of claim 1,
wherein the base die comprises a buffer configured to buffer the base data, and
wherein the base die transmits the transmission signal through the transmission line based on a transmission enable signal and an output signal of the buffer.

5. The memory device of claim 1, wherein the transmission enable signal is enabled to transmit the transmission signal through the transmission line.

6. The memory device of claim 1, wherein the core die:
shifts a voltage level of the transmission signal, and
outputs the signal having the shifted voltage level as the core data based on a reception enable signal.

7. The memory device of claim 1, wherein the reception enable signal is enabled to receive the transmission signal from the core die through the transmission line.

8. A memory device comprising:
a base die configured to drive a level of base data to a first voltage range and configured to shift the level of the base data from the first voltage range to a second voltage range and configured to transmit transmission data through a transmission line based on a transmission enable signal; and
a core die configured to generate core data based on the transmission data and a reception enable signal,
wherein the second voltage range is higher than the first voltage range.

9. The memory device of claim 8,
wherein the first voltage range is set between a first power and a ground voltage, and
wherein the second voltage range is set between a second power and the ground voltage, and
wherein a voltage level of the second power is higher than a voltage level of the first power.

10. The memory device of claim 8, wherein the base die comprises:
a buffer configured to buffer the base data in the first voltage range;
a level shifter configured to output an output signal of the buffer by shifting a voltage level of the output signal to the second voltage range; and
a driving circuit configured to output the transmission data through the transmission line by driving the transmission data based on the output signal of the level shifter and the transmission enable signal.

11. The memory device of claim 10, wherein the transmission enable signal is enabled to transmit the transmission signal through the transmission line.

12. The memory device of claim 10,
wherein the level shifter is implemented by using a plurality of multiple MOS transistors, and
wherein an insulating layer of some MOS transistors that operate in the second voltage range, among the plurality of MOS transistors, are set to be thicker than an insulating layer of the remaining MOS transistors.

13. The memory device of claim 10,
wherein the driving circuit is implemented by using a plurality of multiple MOS transistors, and
wherein an insulating layer of some MOS transistors that operate in the second voltage range, among the plurality of MOS transistors, are set to be thicker than an insulating layer of the remaining MOS transistors.

14. The memory device of claim 8, wherein the base die comprises:
a buffer configured to buffer the base data in the first voltage range;
a level shifter configured to output an output signal of the buffer by shifting a voltage level of the output signal to the second voltage range;
a duty ratio adjustment circuit configured to output the output signal of the level shifter by adjusting a duty ratio of the output signal; and
a driving circuit configured to output the transmission data through the transmission line by driving the transmission data based on the output signal of the duty ratio adjustment circuit and the transmission enable signal.

15. The memory device of claim 14, wherein each of the level shifter, the duty ratio adjustment circuit, and the driving circuit is implemented by using a plurality of MOS transistors, and wherein an insulating layer of some MOS transistors that operate in the second voltage range, among the plurality of MOS transistors, are set to be thicker than an insulating layer of the remaining MOS transistors.

16. A memory device comprising:

a core die configured to generate transmission data in a second voltage range by buffering core data and configured to transmit the transmission data to a transmission line; and a base die configured to buffer the transmission data, configured to shift a voltage level of the transmission data to a first voltage range, and configured to generate one of normal data and repair data depending on whether the transmission data are repaired, wherein the base die is configured to generate the repair data when the transmission data includes an error.

17. The memory device of claim 16, wherein the first voltage range is set between a first power and a ground voltage, and wherein the second voltage range is set between a second power and the ground voltage, and wherein a voltage level of the second power is higher than a voltage level of the first power.

18. The memory device of claim 16, wherein the base die comprises:

a data reception circuit configured to buffer the transmission data in the second voltage range based on a reception enable signal;

a level shifter configured to shift a voltage level of an output signal of a buffer to the first voltage range; and a data selection generation circuit configured to selectively generate one of the normal data and the repair data from an output signal of the level shifter based on the reception enable signal and a repair enable signal.

19. The memory device of claim 18, wherein the reception enable signal is enabled to receive the transmission data when there is no error in the transmission data.

20. The memory device of claim 18, wherein the repair enable signal is enabled to receive the transmission data when there is an error in the transmission data.

21. The memory device of claim 18, wherein the data selection generation circuit:

generates the normal data from the output signal of the level shifter when the reception enable signal is enabled, and generates the repair data from the output signal of the level shifter when the repair enable signal is enabled.

22. The memory device of claim 20, wherein each of the data reception circuit, the level shifter, and the data selection generation circuit is implemented by using a plurality of MOS transistors, and wherein an insulating layer of some MOS transistors that operate in the second voltage range, among the plurality of MOS transistors, are set to be thicker than an insulating layer of the remaining MOS transistors.

23. A memory device comprising:

a core die configured to generate transmission data by buffering core data in a second voltage range and configured to transmit the transmission data to a transmission line; and a base die configured to shift a voltage level of the transmission data to a first voltage range and configured to generate one of normal data and repair data depending on whether the transmission data are repaired, wherein the base die is configured to generate the repair data when the transmission data includes an error.

24. The memory device of claim 23, wherein the base die comprises:

a level shifter configured to shift the voltage level of the transmission data to the first voltage range; and a data selection generation circuit configured to selectively generate one of normal data and repair data from an output signal of the level shifter based on a reception enable signal and a repair enable signal.

25. The memory device of claim 24, wherein each of the level shifter and the data selection generation circuit is implemented by using a plurality of MOS transistors, and wherein an insulating layer of some MOS transistors that operate in the second voltage range, among the plurality of MOS transistors, are set to be thicker than an insulating layer of the remaining MOS transistors.

* * * * *